United States Patent [19]

McCambridge

[11] Patent Number: 4,885,583
[45] Date of Patent: Dec. 5, 1989

[54] SERIAL TO PARALLEL DATA CONVERSION SYSTEM

[75] Inventor: John M. McCambridge, Northville, Mich.

[73] Assignee: Chrysler Motors Corporation, Highland Park, Mich.

[21] Appl. No.: 270,918

[22] Filed: Nov. 14, 1988

[51] Int. Cl.$^4$ .............................................. H03M 9/00
[52] U.S. Cl. .................................................... 341/100
[58] Field of Search ................................... 341/100, 50

[56] References Cited

U.S. PATENT DOCUMENTS

| | | |
|---|---|---|
| 3,310,626 | 3/1967 | Cassidy, Jr. ................... 341/100 X |
| 3,703,719 | 11/1972 | Beyer et al. ......................... 341/100 |
| 4,447,804 | 5/1984 | Allen ................................... 341/100 |

Primary Examiner—William M. Shoop, Jr.
Assistant Examiner—Sharon D. Logan
Attorney, Agent, or Firm—Wendell K. Fredericks

[57] ABSTRACT

A data reception device extracts serial, unipolar data from both current mode and voltage mode differential transmission links and converts such data into parallel data suitable for use by end-user equipment.

9 Claims, 7 Drawing Sheets

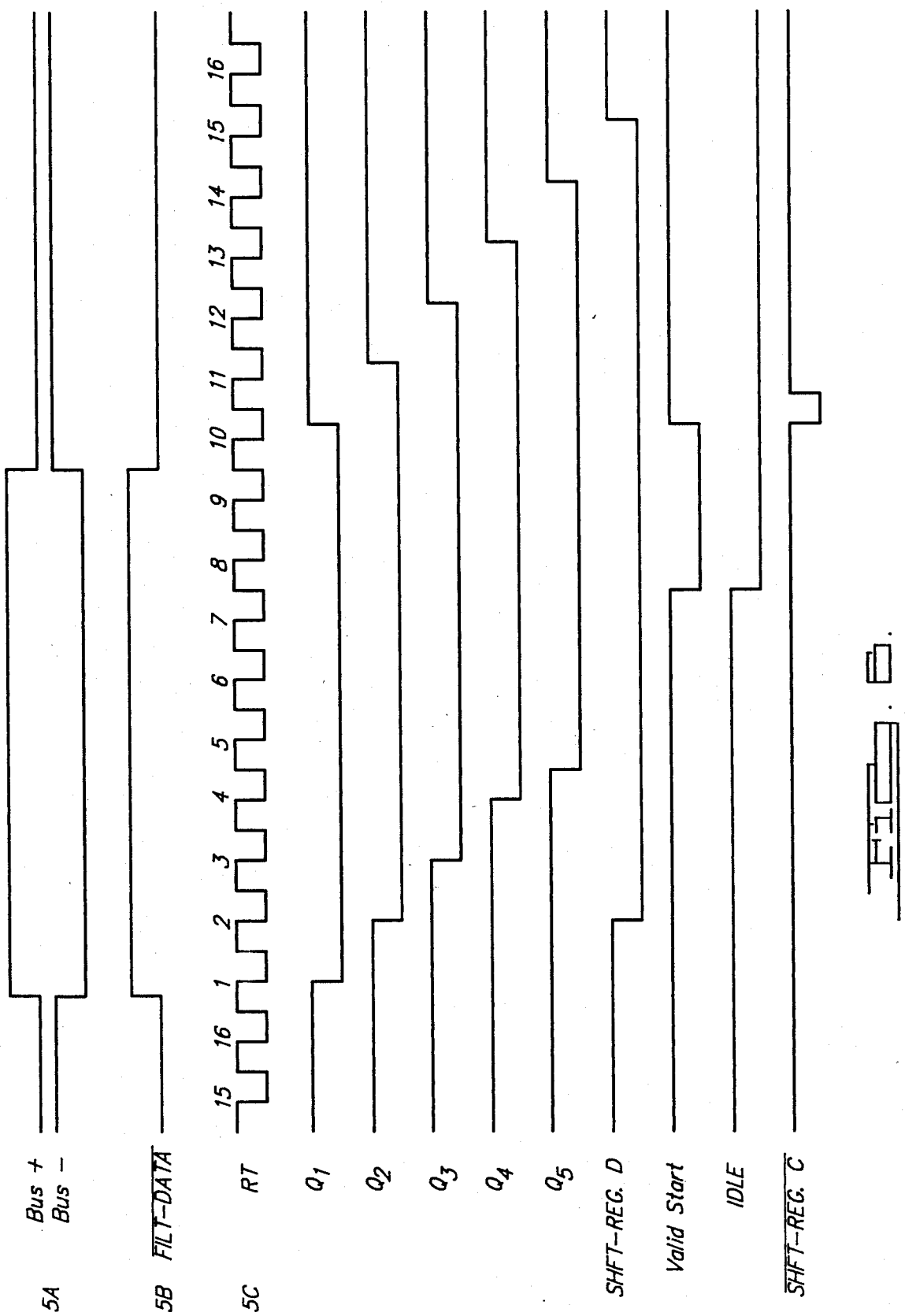

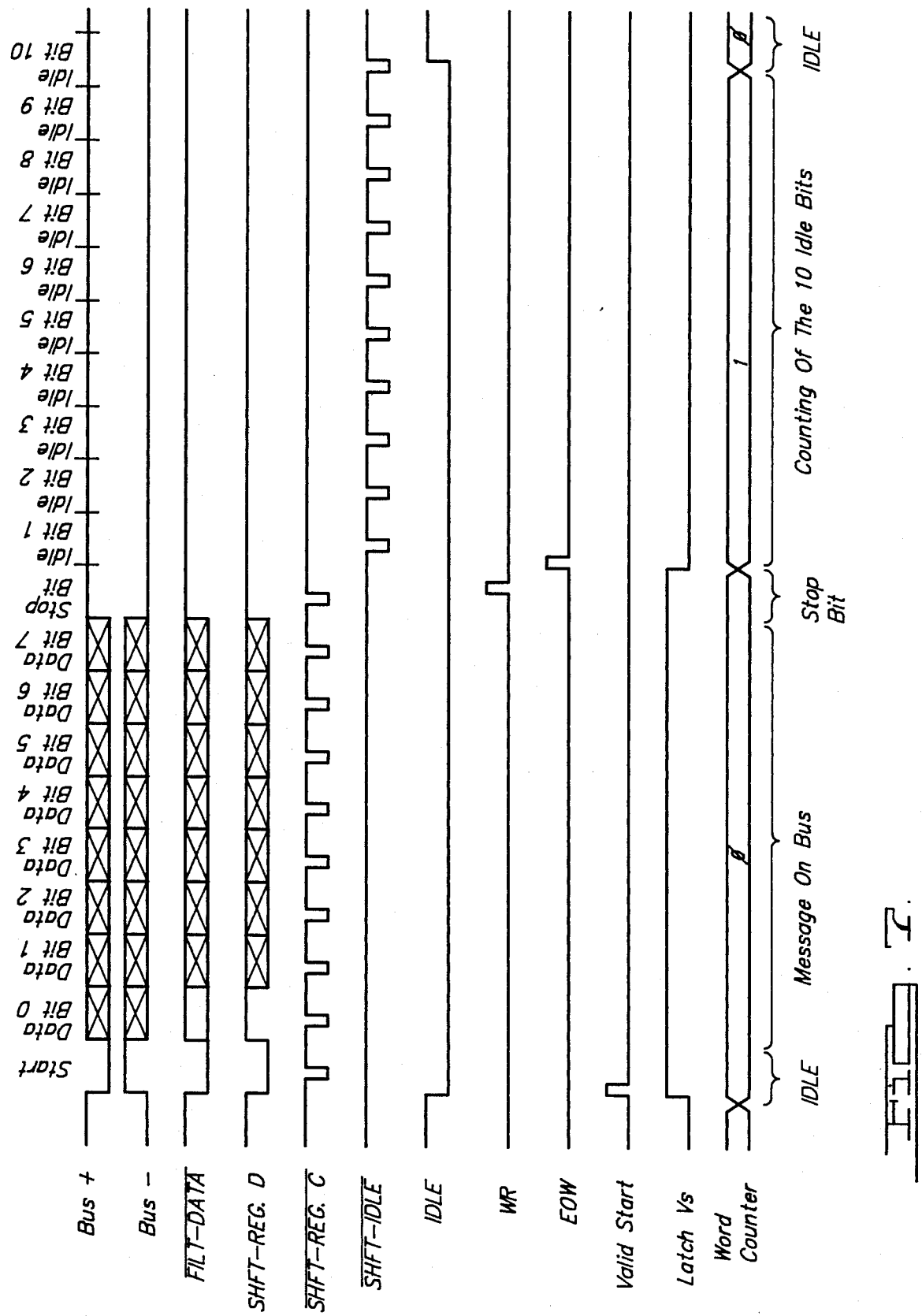

SERIAL TO PARALLEL DATA CONVERSION SYSTEM

BACKGROUND OF THE INVENTION

1. Field of the Invention

The present invention relates generally to serial to parallel data converting and more particularly to an improved data reception device for converting asynchronous simplex data into parallel words transmitted over a differential mode medium.

2. Description of Prior Art

In the computer and communications world, useful communication require at least one sender of communicable information to send information over a medium to at least one suitable receiver. However, many multiple driver/receiver combination systems such as a current mode system described in U.S. Pat. No. 4,739,323 of Miesterfeld et al. entitled "Serial Data Bus For Serial Communication Interface (SCI), Serial Peripheral Interface (SPI) And Buffered SPI Modes of Operation" and a voltage mode Electronic Industries Association (EIA) standard RS-485 system transfer information back and forth over balanced lines, bus or link which could be, if tapped, used by individual data reception devices for use with equipment that function completely independent, except for the tapped information, of those connected to the link.

A problem exists in finding such a data reception device having an interface compatible with the various signalling modes used by the multiple driver/receiver combination systems. A current mode interface in a data reception device may not permit interfacing the reception device to a voltage mode system.

Also, even after finding such a data reception device, a problem exists in verifying that transmitted data have been received exactly as sent; i.e., no errors introduced by the sending mechanism, the transmission medium or the reception device.

Another problem exists in deciphering the transmitted data and organizing it such that other unrelated equipment users may effectively us the information for their own purposes.

BRIEF SUMMARY OF THE INVENTION

The present invention concerns a novel data reception device that interfaces with driver/receiver combination systems connected to either a current mode or a voltage mode differential transmission link and provides to external equipment parallel data derived from, e.g., extracted serial, unipolar non-return-to-zero (NRZ) data communicated over the differential link. The parallel data permits the external equipment to perform functions completely independent of the functions performed by equipment associated with the link.

The data reception device detects out-of-range common mode voltage and current signals and inhibits entry of the out-of-range signal placed on the link emanating from interfering sources within the driver/receiver combinations connected to the link or which enter the link from environmental sources. Also, out-of-range voltage and current signals are continuously monitored and an error signal generated if out-of-range occurs while each bit is sampled.

This data reception device provides the end-user device, along with each symbol or word of the parallel message derived from the link, a signal indicative of a valid START of each word, the end of it, and the presence of the first through Nth word of each message. Also, a control signal is provided which signals the end-user device when to accept each parallel byte within the message. A framing error signal lets the end-user device know of the occurrence of a framing error in any of the data bytes and an out-of-range signal notifies the end user device of the occurrence of an out-of-range condition.

Each byte illustratively contains, within a frame, a START bit followed by 8 data bits followed by a STOP bit. In this particular arrangement, up to 8 bytes constitute a message with 10 IDLE bits separating each message. Sampling of each bit in each byte of data transferred over the differential lines is performed at 16 times (16X) the baud rate. A baud rate generator can provide for clock signals to accommodate various baud rates.

BRIEF DESCRIPTION OF THE DRAWING

FIGS. 6 and 7 illustrate timing diagrams of the system.

DETAILED DESCRIPTION OF A PREFERRED EMBODIMENT

Block Diagrams

Figure 1:
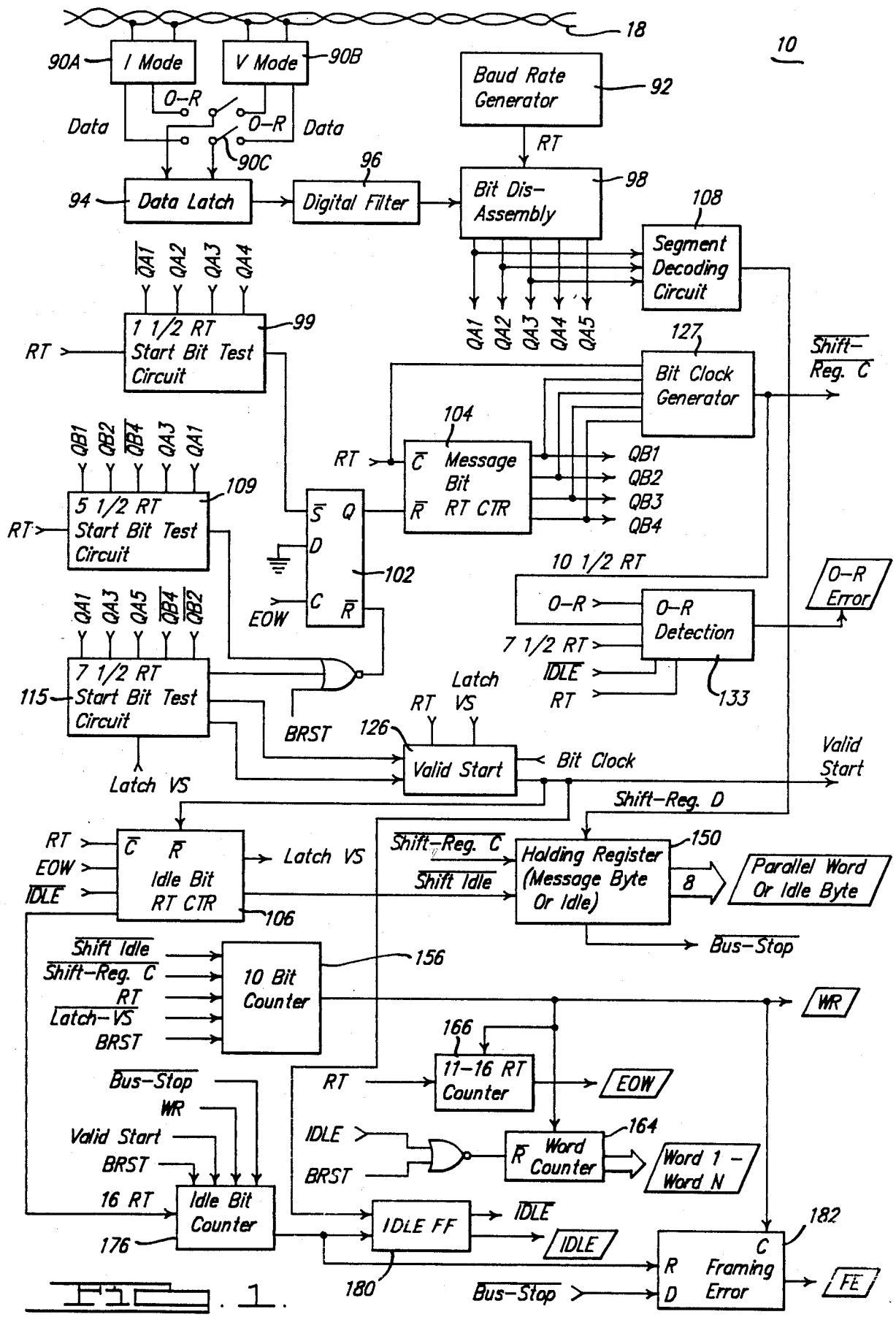
FIG. 1. illustrates an overall block diagram of the data reception device of this invention.

With reference to FIG. 1, there is shown a block diagram of the data reception device 10 of this invention. Messages may appear on a link 18 as either current or voltage mode signal indications of mark and space conditions. Current and voltage mode signals route to I and V-mode interface modules 90A and 90B, respectively, via switch 90C. Interface circuit 90A or B sequentially converts the serially transferred marks and space signals into a series of unfiltered binary bits compatible with the corresponding binary logic bit signals placed on link 18 by the sender and then transfers each bit serially at the sending baud rate into a data latch 94. If an out-of-range signal enters interface 90A or B, an inhibit signal issues causing the latch 94 to store the bit that just preceded the out-of-range signal. The inhibit signal remains until in-range mark and space conditions return.

Each bit passing through latch 94 gets filtered by a conventional digital filter 96 prior to entering a bit disassembly circuit 98. A baud rate generator 92 provides a clock signal (RT) to circuit 98 that ticks 16 times (16X) the baud rate of the bits leaving filter 96. Circuit 98 uses these RT ticks to disassemble each bit into 16 segments to allow a sampling and a voting procedure to transpire involving the segments.

A segment decoding circuit 108, a 1½ RT START bit test circuit 99, a 5½ RT START bit test circuit 109 and a 7½ RT START bit test circuit 115 sample selected one-sixteenth segments of the START bit until a Valid Start signal occurs at 7½ RTs. Segment decoding circuit 108 performs a vote to determine the dominant logic level of the 8, 9 and 10th segments of each bit processed by system 10. A bit receives a logic 1 or HIGH classification if at least 2 out of 3 of the 8, 9, and 10th segments come through the segment decoding circuit as HIGH segments and a logic 0 or LOW classification if the opposite occurs. The decoding of the 8, 9, and 10th segments generate a SHFT-REGD logic 1 or 0 signal that represents a start, data, stop or idle bit.

The three START bit test circuits work in conjunction with a message bit RT counter 104. Counter 104, a four stage binary counter which is initially in a reset condition, counts each RT clock tick after being enabled by the first start bit segment. The 1½ RT START bit test circuit 99 looks for a logic 0 or NOT QA1 which is indicative of a change from a logic 1 mark condition, (IDLE signal) to a logic 0 START bit signal or more specifically to the first 1/16th segment of the logic 0 START bit. If this occurs while QA2, QA3, QA4 (the last segments of the last STOP or IDLE bit) remain as logic 1 segments, flip-flop 102 sets enabling counter 104 to start counting the RT clock ticks. If this chosen pattern does not occur, counter 104 remains reset. If the pattern occurs, then the 5½ RT START bit test circuit 109 looks at a particular count in the message bit RT counter 104 along with a segment pattern QA1 and QA3 upon the 15 occurrence of the 5½ RT clock ticks. At 5½ RT, if segments QA1 or QA3 is LOW, then the counter 104 continues to count. If QA1 and QA3 are both HIGH, then a reset signal from circuit 109 resets latch 102 which, in turn, stops counter 104 from counting, causing the count of the RT's by counter 104 to begin anew.

If counter 104 counts passed 5½ RTs, the 7½ RT START bit test circuit 115 samples a segment pattern of QA1, QA3 and QA5. The majority of QA1, QA3 and QA5 must be a logic zero. If the pattern does not occur, a RESET signal from circuit 115 RESETS latch 102 which in turn stops counter 104, causing the count of the RT's by counter 104 to begin anew signifying that START bit segments have not been detected. If the pattern does occur, then a valid START circuit 126 activates and issues a valid START signal that the end-user device may use to prompt circuits in the end user device of the occurrence of the start of a usable byte in a message.

After a valid START signal, the segment decoding circuit 108 becomes of significance. The segment decoding circuit 108 performs essentially a vote to determine the dominant logic level of the 8th, 9th and 10th segments. A bit receives a logic 1 or HIGH classification if at least two out of three of the 8th, 9th and 10th segments come through the segment decoding circuit as HIGH segments, and a logic 0 if at least two of the three segments are LOW. A LOW signal could represent a START bit, a logic 1 could represent a STOP or IDLE bit and either a logic 1 or 0 which could represent data bits.

Once the valid START signal occurs at about 7½ RT's, flip/flops 180 and 120 set producing a low IDLE signal and a LATCH-VS signal respectively. Also the 10 IDLE bit counter 176 which counts the 10 idle bits during an IDLE interval is reset. The LOW IDLE signal enables over-range error latch 140 to check the mark and space signals entering the interface module during processing of the 8th, 9th and 10th segments of the disassembled bit and enables Word Counter 164 to count the number of parallel words processed by system 10. The LATCH-VS signal resets the idle bit RT counter 106 which prevents the generation of the not SHFT-IDLE signal used as a clock signal for clocking SHFT-REGD bits into holding register 150 during the transmission of idle bits.

Also, after the LATCH-VS signal occurs, the segment decoding circuit 108 looks at the 8th, 9th and 10th segments of the START bit. At 10½ RT, the data bit shift register clock signal, not SHIFT-REGC signal, occurs. The START bit value is placed in the first stage of holding register 150.

Also, the LATCH-VS signal enables a 10 data bit counter 156. Thereafter counter 156 counts each bit placed in HOLDING register 150. When 10 data bits are counted, namely, the START bit, 8 data or information bits and the STOP bit, a WRITE latch 158 sets causing a WR signal to issue.

Prior to each bit entering HOLDING register between 7½ and 10½ RT where the 8th, 9th and 10th segments are being scrutinized to determine the polarity of the bit by segment decoding circuit 108, the O-R detection circuit 133 looks at the O-R output of the interface module, 90A or 90B. If the O-R output is HIGH, at the time the 8th, 9th, or 10th segments are sampled then the over-range error latch sets causing the issuance of a low OVR-ERR signal that the end-user device may use as a warning of corruption in the transmission.

After all 10 bits of each word have been placed in HOLDING register 150, after 10 cycles of the not SHFT-REGC signal and after the issuance of the WR signal, there is a need to count the remaining six RT's of the STOP bit in order to maintain synchronization. Hence, an 11 to 16 RT counter 166 counts the remaining RT's and then causes the issuance of an END-OF-WORD (EOW) signal to the end-user device and to the VALID START latch which enables the VALID START flip/flop to receive a VALID START indication for the next succeeding word.

Also, the EOW signal enables the 1½ RT START bit test circuit 99 to initiate the search for the next START bit.

Hence, prior to the issuance of each END-OF-WORD (EOW) signal to the end-user device, the end-user device is informed of the formation of each byte of each word. The WR signal from the WRITE latch 158 gets counted by WORD counter 164. Counter 164 is a 3 bit ripple counter, the outputs of which can be read by the end user device, to determine which bit has been entered. For example the counter is zero when the first WR occurs, and is a one when the second WR occurs.

In addition to enabling the VALID START latch 120, the EOW signal enables the IDLE BIT RT counter 106. Hence, if a VALID START signal does not occur after an EOW, then the system assumes idle bits are being transferred over link 18. This usually occurs after three successive words have been transmitted or when the message words are interrupted.

The IDLE BIT RT counter 106 counts 10 RT's of each idle bit before issuing a not SHFT-IDLE clock signal to the HOLDING register 150 for clocking the SHFT-REGD idle bit signal from the segment decoding circuit after the polarity of the 8th, 9th and 10th segments of each idle bit is determined. Counter 106 also issues a not QE8 signal at 16 RT to the 10 IDLE BIT counter 176. Counter 176 counts 10 of these QE8 signals and then causes the IDLE latch 180 to set which, in turn, issues a HIGH IDLE signal. The HIGH IDLE signal resets the WORD counter 164, the IDLE BIT RT counter 106 and the framing error detector 182, while the not IDLE signal resets OVR-ERR latch. Hence, if after the 10 idle bits are counted, if a VALID START bit is detected, the word counter will begin counting from zero, over-range errors can be detected at the center of the bit. If the VALID START bit is not detected, then the IDLE BIT RT counter 106 will start counting the RT time representations of the occurrence of idle bit segments.

Logic Diagrams

Figure 2:
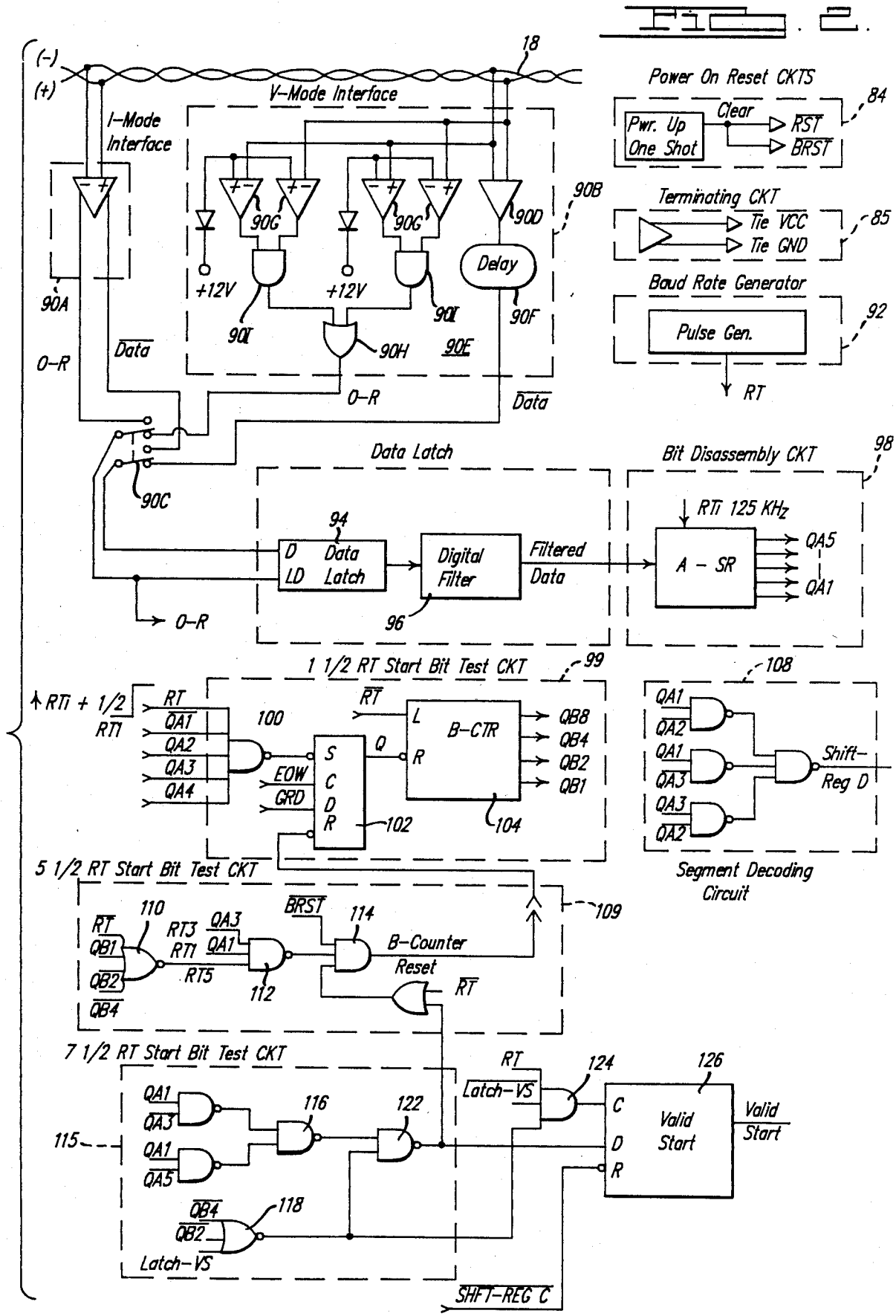
FIGS. 2, 3 and 4 illustrates in partial block and partial schematic diagram form the logic circuits depicted in the block diagram of FIG. 1.

Referring now to FIG. 2, there is shown the I-mode and V-mode interface circuits 90A and 90B, respectively, with input terminals connected to link 18. The receiver portion of the GE/RCA serial bus interface CDP68HC6851 mentioned supra serves as the I-mode interface circuit 90A. The I-mode interface circuit includes, in addition, the line receiver, an out-of-range circuit (note shown) that provides indications of abnormal I-mode mark and space conditions. The output of circuit 90A goes to one of the two sets of a double throw switch 90C. Switch 90C may be a manual switch or a separately controlled solid-state switch.

The V-mode interface 90B comprises a line receiver 90D and out-of-range circuit 90E. The line receiver 90D, a quadruple differential line receiver of a type SN75175 of Texas Instruments of Dallas, Tex., has a non-inverting input connected to the plus side of link 18 and an inverting input connected to the negative side of link 18 in order to accept the differential voltage signals. The output of line receiver 90D goes HIGH if the differential voltage at the input is greater then 200 MV and goes LOW if the input is less then 200 MV; hence, the serial information on link 18 is converted to serial logic level signals. The output of receiver 90B connects to a delay line 90F which suitably delays the data from receiver 90B in order that any out-of-range signal from circuit 90E reaches data latch 94 prior to the data from receiver 90B. The output of the delay line connects to a fixed terminal of switch 90C.

The out-of-range circuit 90E comprises a quad operational amplifier 90G, OR gate summing circuit 90H and AND gate 90I. One half of the quad amplifiers 90G are used to test link 18 for voltages below minus 12 volts and the other pair of quad amplifiers are used to test link 18 for signals greater then plus 12 volts. Each pair of the quad amplifiers connect differentially across link 18; hence, if both plus 12 volt amplifiers sense an out-of-range signal, the output of summing circuit 90H will indicate a HIGH signal. Likewise, if both of the operational amplifiers sampling the minus 12 volt limits of link 18 detect an out-of-range signal, the output of the summing circuit will go HIGH. The output of the summing circuit 90H connects to a fixed terminal of switch 90C, the compliment of the fixed terminal connected to the output of the delay line of the line receiver 90D.

Data Latch

Signal lines from the moveable or switching terminal of switch 90C connect the I or V mode interface circuits 90A and 90B, respectively, to data latch 94. Latch 94, a conventional D-type latch has a data (D) terminal for receiving data and a latch data (LD) an active-high enabling terminal connected to the over-range (O-R) signal terminal of switch 90C. HIGH and LOW serially transferred data bits enter latch 94 and pass through it, provided the O-R signal is LOW. If a HIGH out-of-range signal occurs, this will disable the latch 94 prior to the associated data bit signal in order to prevent any corrupt data from being passed through latch 94. Any data bit currently in latch 94 will remain latched during periods when out-of-range signals appear on link 18.

Bit Disassembly Circuits

Each logic signal bit passing through latch 94 gets filtered by the digital filter 96 to rid the bit from noise interference of a chosen noise spectrum prior to the bit entering a bit disassembly circuit 98. Circuit 98 is a five-stage, serial input, parallel output shift register clocked by RT clock ticks from a baud-rate, generator 92. Generator 92 runs at a frequency of 16 times the baud rate of the logic bit signals leaving filter 96. We refer to an individual period of the baud rate generator as RT. Circuit 98 receives each logic bit signal and disassembles it into 16 separate segments. In an effort to conserve logic elements, only five out of the possible 16 segments appear at the output of circuit 98 at any given time. After the 5th RT, the first 5 segments appear at the QA1–QA5 terminals of circuit 98. After the 10 RT, the output QA1–QA5 reflects the bit segments disassembled at the fifth through tenth RT clock ticks and so on. After the 16th RT, the QA1 of circuit 98 now reflects the first segment of the next bit.

Valid Start Test Circuits

Bit disassembly circuit 98 distributes bit segments (QA1–QA16) to four different circuits, namely, three START bit test circuits and a segment decoding circuit.

The purpose of the START bit test circuit is to make sure the zero that has been clocked in is data and not noise.

The 1½ RT START bit test is used to determine if the current sample is zero while the previous three samples are HIGH. The 1½ RT START bit test circuit 99 which includes a 4-input NAND gate 100, a D-type positive edge triggered flip-flop 102, and a 4-stage binary counter 104. This circuit operates after a preceding EOW signal, at the clock (C) input, clocks a LOW ground signal at (D) terminal through flip-flop 102 to reset the (B-CTR) binary counter to zero. The EOW signal occurs after 10 complete bits are processed. Then, the EOW signal is reset to LOW by the next RT. At 1½ RT, the compliment of QA1 (not QA1) from the bit disassembly circuit 98 appears along with QA2–QA5; the 13th, 14th, 15th and 16th segments of the previous bit, usually a STOP or IDLE bit both of which would be indicated by HIGH bit segments. Hence, at 1½ RT, the output of NAND gate 100 would go to a LOW level causing a LOW at the set (Ŝ) input of flip-flop 102 which, in turn, causes a HIGH output signal which is applied to the R terminal of counter 104 enabling counter 104 to count each RT from zero RT to 15 RT or until counter 104 is reset by a failed START bit test or an EOW.

If the 1½ RT test fails; i.e., NAND gate 100 does not produce a LOW at 1½ RT, then the Q output of flip-flop 102 remains LOW, which keeps counter 104 reset.

5½ RT Start Bit Test Circuit

If either outputs QA1 or QA3 segments of the start bit are LOW at 5½ RT, the output of AND gate 114 will remain HIGH allowing counter 104 to count RT's. At 5½ RT, the output of counter 104 should indicate a count of 4. This indicates system 10 is 5/16 through the processing of the START bit.

Note that the NOT BRST signal from the power on reset circuit 84 is used. This circuit resets the logic circuits during power-up of system 10. Also, terminating circuit 85 is used to tie unused pins to ground or $V_{cc}$.

7½ RT Start Bit Test Circuit

This circuit samples the third, fifth and seventh segments of the START bit. If any two of the segments are HIGH, the R-input of flip-flop 102 will go LOW resetting the flip-flop which, in turn, resets counter 104, stopping the count of RT's during the START bit segmenting.

If two of three segments, three, five and seven, remain LOW, at 7½ RT the C input of flip-flop 126 will clock a HIGH signal at the D input causing the Q-output to go HIGH producing a VALID-START signal. The VALID-START signal remains from 7½ RT until 10½ RT when the NOT SHFT-REG C is generated and produces a LOW at the R-input of flip-flop 126 causing it to RESET.

Figure 3:
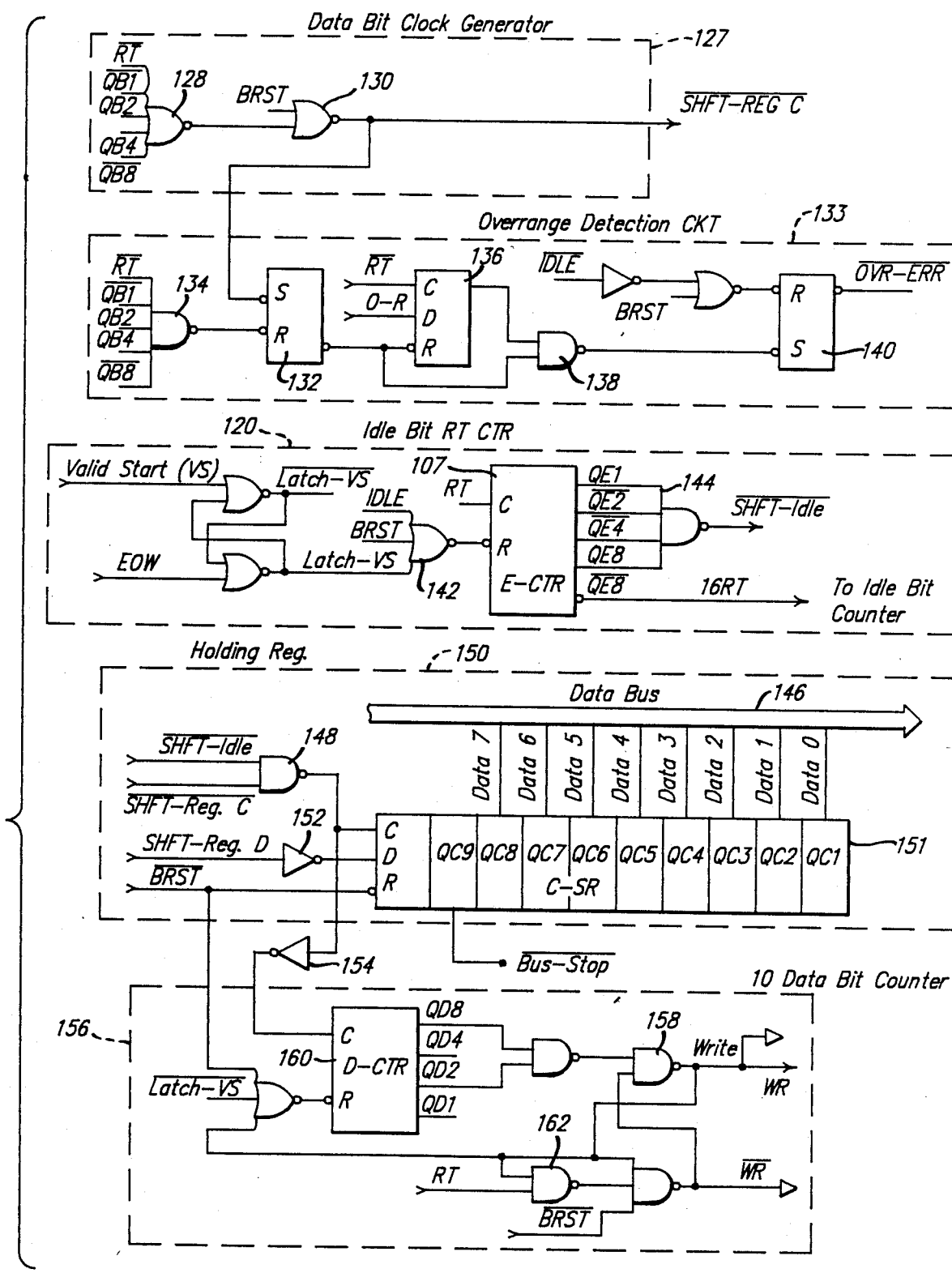
Figure 4:
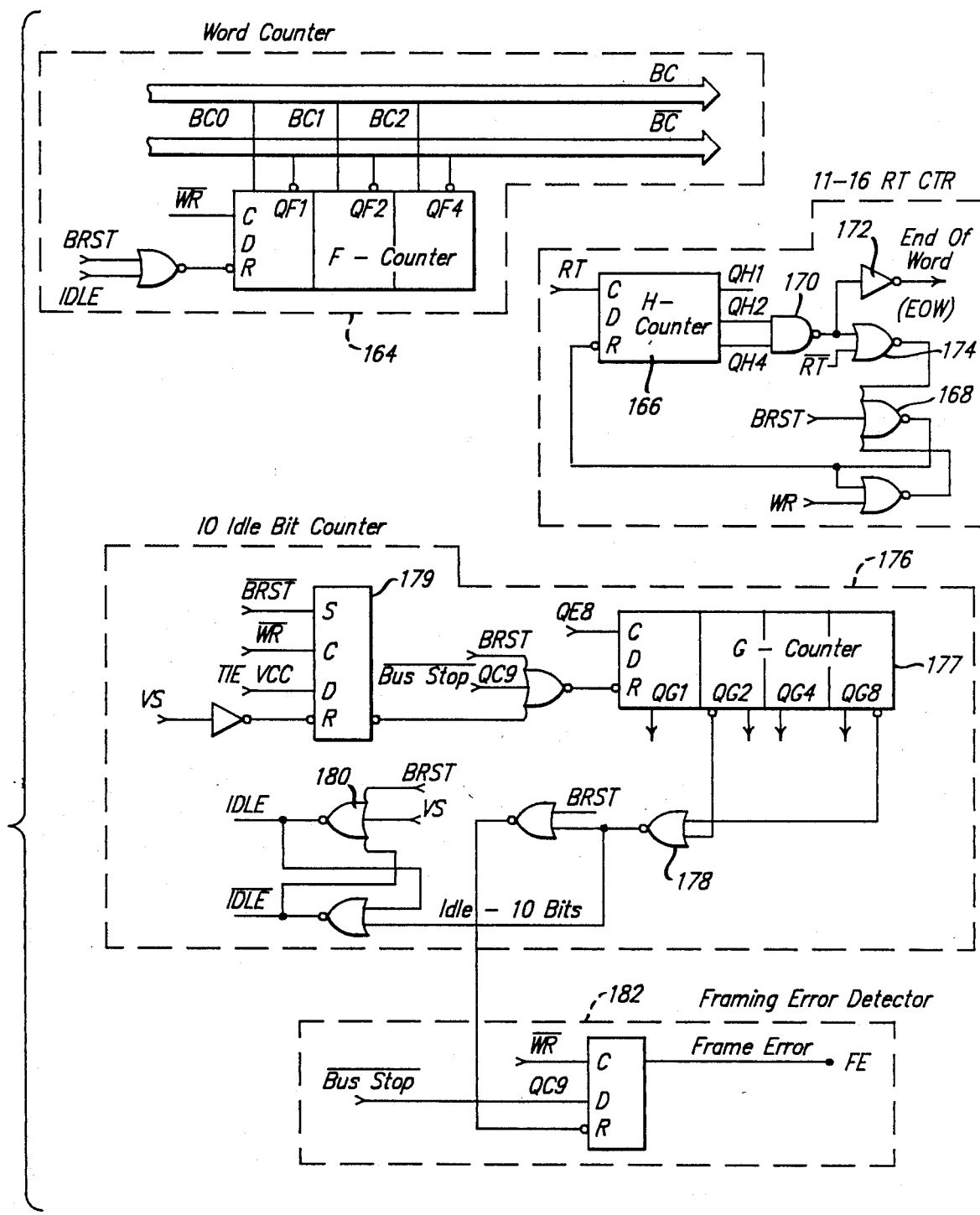

Turning now to FIGS. 3 and 4, once the valid Start (VS) signal occurs, the LATCH-VS flip-flop 120 of FIG. 3 sets producing a HIGH LATCH-VS signal which, in turn, causes the R-input of 107 in idle bit RT counter 106 of FIG. 3 to be held in a reset state preventing the generation of the NOT SHFT-IDLE clock signal used to place idle bits into holding register 150. The NOT LATCH-VS signal also is applied as a LOW signal to the reset (R) input on the D counter 160 in the 10 data bit counter 156 so as to remove the reset condition and allow counter 156 to count the 10 data bits as they are clocked into Holding Register 150 by the NOT SHFT-REG-C signals that occur 10 times, one for each of the 10 bits of the word that is processed.

In addition to resetting the Idle Bit RT counter 106, the valid start (VS) signal also resets the 10 Idle Bit Counter 176 of FIG. 4 and the Idle flip-flop 180.

However, the LOW NOT Idle signal from flip-flop 180 along with the LOW BRST signal resets the NOT OVR-ERR flip-flop 140 of FIG. 3 and the Idle signal from 180 resets the WORD counter 164 of FIG. 4.

Holding Register

After the VS signal goes LOW at 10½ RT, the SHFT-REGD signal of FIG. 2, which has the same polarity of the majority of the 8th, 9th and 10th segments, is clocked into the Holding Register 150 in response to the not SHFT-REGC clock signal of FIG. 3. Note that if the 10th bit clocked into Holding Register 150 is LOW or any LOW bit clocked in while latch VS is high; i.e., the not STOP Bit signal is HIGH, then an error has occurred and a HIGH NOT Bus Stop signal is generated and routed to the 10 Idle Bit counter 126 of FIG. 4 to reset it so as to lengthen the 10 bit idle time. The NOT bus-stop also routes to the Framing Error Detectors 182. Detector 182 generates a HIGH Framing Error (FE) signal when the NOT WR clock signal occurs after 10 bits have entered Holding Register 150.

Idle Bit Counting

As shown in FIG. 3, the NOT SHFT-IDLE signal clocks SHFT-REGD idle bit signals into Holding Register 150 every 10½ RT's until the 10 Idle Bit Counter 176 of FIG. 4 counts ten not QE8's. The not QE8 signal occurs at 16 RT's for each idle bit segmented and processed by system 10. When 10 not QE8's are counted, the idle flip-flop 180 SETS causing the generation of the Idle signal. The Idle signal RESETs the Word Counter 164 and the Idle Bit RT counter 106 of FIG. 3.

Flow Charts

Figure 5:
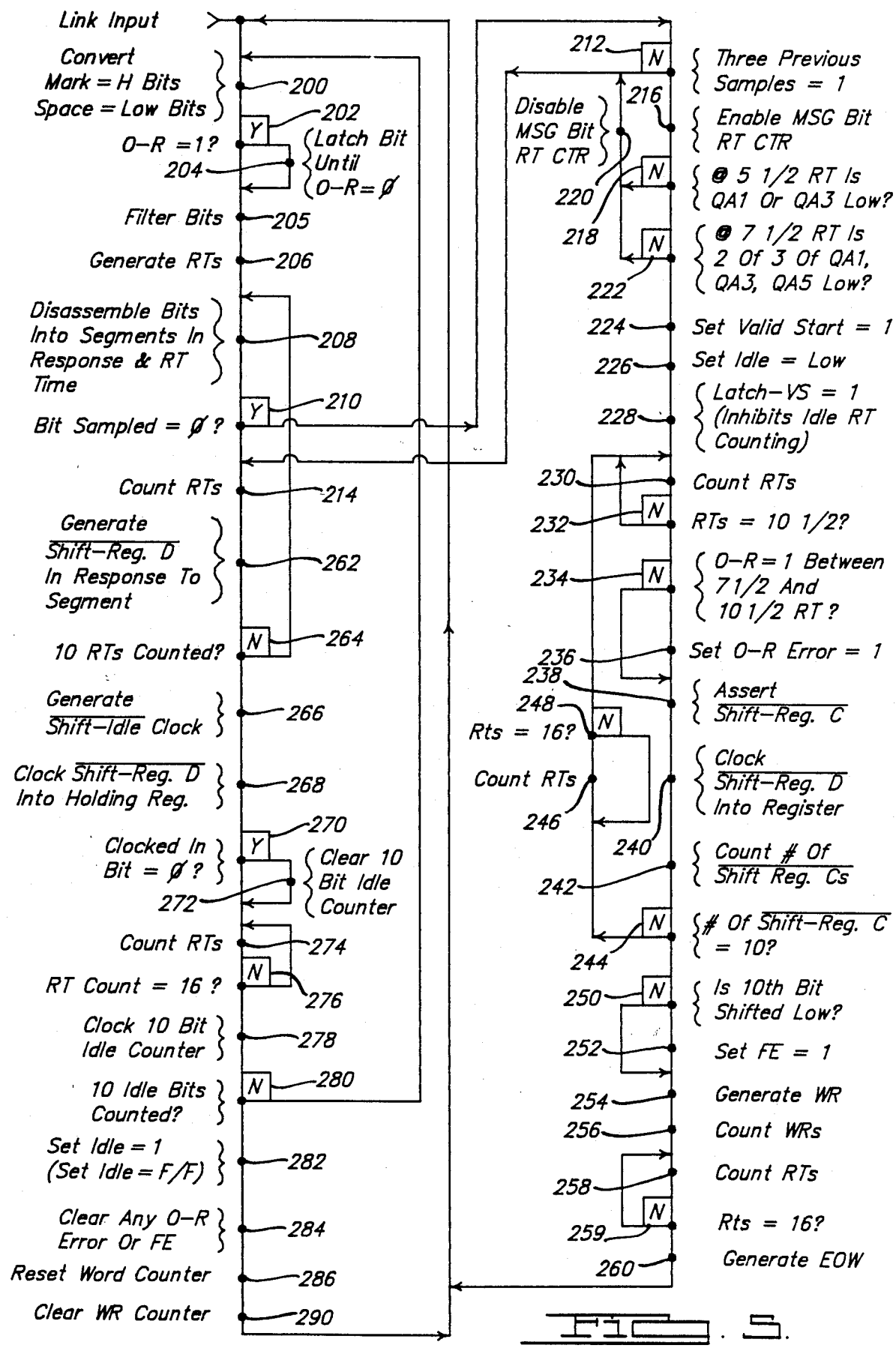
FIG. 5 illustrates a flow diagram of the operation of the data reception device.

The flow chart diagrams of FIG. 5 differ from the conventional box and diamond flow charts. In FIG. 5, flow of control passes along lines and proceeds down the page. Conventional start up of program and end of program boxes are used. Actions are signified by a small black circle on the lines, the description of the action being given to the left or right of the flow lines. Actions only take place on vertical lines. When a decision has to be introduced, the flow line branches to the right or left. The branch may be caused by either a YES or NO condition, with this being signified by a Y or N in a box as indicated. Where secondary flow rejoins the main flow an arrowhead is used. A reference number will indicate the points along the line being discussed.

In FIG. 5, mark and space signals enter data reception system 10 from link 18 and the interface circuits convert each mark and space signal into a HIGH and LOW, respectively, logic level signal as indicated at dot 200.

System 10 interrogates each mark and space to determine if the signal is out-of-range (O-R) as decision block 202 indicates. If an O-R signal occurs, the Y or yes branch is taken to dot 204 where system 10 latches the previously transmitted bit in data latch 94 until removal of the O-R conditions. If no O-R condition occurs, or after removal of the 0-R condition, the system 10 filters the bit at Latch output as indicated at dot 10.

To synchronize further processing of each bit, system 10 generates the 16x baud rate clock signal RT as indicated at dot 206. Then, system 10 disassembles each bit into 16 bit segments in response to the RT's as shown at dot 208.

System 10 then checks to see if the bit sample is a logic zero at decision block 210. If the bit sampled is a logic one, system 10 assumes Idle bits are being received and proceeds to dot 214 where a count of the Idle bit segment is preformed.

If the sampled bit is a Logic zero, the Y branch is taken where system 10 at decision block 212 checks to see if the three previous bit segments are HIGH. If not, the N branch is taken and system 10 assumes again that idle bits are being received and proceeds to dot 214. If the three previous bit segments are HIGH, system 10 enables the message bit RT counter as indicated at dot 216. When the count in the message bit RT counter reaches a count of 4 at 5½ RT's, system 10 checks as indicated at decision block 218 to see if shift register outputs QA1 or QA3 are LOW. If not, the N-branch is taken and system 10, disables the Message Bit RT counter as indicated at dot 220 and then proceeds to dot 214 which indicates system 10 is counting RT's under the assumption that idle bits are being transferred. If QA1 or QA3 is LOW, then system 10 checks as indicated at decision block 222 at 7½ RT to see if two of the three shift register outputs, QA1, QA3 and QA5, are LOW. If not, the N-branch is followed; the message bit RT counter is disabled as indicated at dot 220. If these three segments are LOW, system 10 generates a HIGH Valid Start indication as shown by dot 224 and then a LOW Idle indication as shown by dot 226. The HIGH Valid Start signal also inhibits Idle RT counting as indicated at dot 228.

After inhibiting Idle RT counting, system 10, as indicated at dot 230, continues to count RT's then system 10 checks to see if 10½ RT's have been reached as in decision block 232. If not, system 10 continues to count RT's. If 10½ RT's have been counted, system 10 checks, as in decision block 234 to see whether any over-range bits have appeared on the link between 7½ and 10½ RT's. If so, as indicated at dot 236, system 10 provides an O-R error=1 signal to the end user device. If not, system 10 goes along the N-branch to dot 238 where the NOT SHFT-REGC clock signal is asserted. Then, as indicated at dot 240, system 10 uses the not SHFT-REGC clock signal to clock the NOT SHFT-REGD bits, the bits that received a HIGH or LOW status, into the Holding Register for forming a 10 bit word.

System 10 counts the number of NOT SHFT-REGC's that occur as indicated at dot 242; then checks as indicated at decision box 244 whether or not the number of NOT SHFT-REGC's equal ten. If not, system 10 uses the N-branch and counts RT's as indicated at dot 246 and then checks as indicated at decision box 248 whether the RT count equal 16. If not, the N-branch is taken back to dot 246 where system 10 continues to count RT's. However, if 16RT's are counted, system 10 goes back to dot 230 where the RT's for the next bit segments are counted and the loop is repeated.

If the number of NOT SHFT-REGC clock signals equal ten, then as in decision box 250, system 10 checks to see if the 10th bit in the Holding Register is LOW. If so, then system 10 provides to the end user device an indication that there is a Framing Error and the FE signal equals 1 as indicated at dot 252. If the 10th bit is not LOW, system 10 uses the N-branch to arrive at dot 254 where a write (WR) signal is generated.

System 10 then counts the number of WR signals as indicated at dot 256. After 10 WR's are counted, system 10 counts the 11-16th RTs of the STOP bit as indicated at dot 258. If the 16th is not counted, system 10 takes the N-branch and continues to count RTs. When the last 16th RT is counted, system 10 generates an End of Word (EOW) signal as indicated at dot 260.

Then, system 10 goes back to dot 200 and looks at the next mark or space placed on link 18.

If, as indicated at decision box 210, the bit segment is not zero or LOW, system 10 assumes that idle bits are being transmitted over the link. Then system 10 counts RT's as indicated at dot 214. Then system 10 proceeds to generate NOT SHFT-REGD bits in response to segments occurring during the 8th, 9th and 10th RTs as indicated at dot 262.

If 10 RTs are not counted, system 10 uses the N branch to continue to disassemble the bit into segments at dot 208 and the loop is repeated.

If 10 RTs are counted, system 10 then generates a NOT SHFT-IDLE as indicated at dot 266 and then use the NOT SHFT-IDLE clock signal to clock the NOT SHFT REGD bits into the Holding Register as indicated at dot 268.

System 10 then checks to see if the bit in the Holding Register is LOW as indicated at dot 220. If so, then system 10 uses the Y-branch to clear the 10 bit idle counter as indicated at dot 272. If not, system 10 checks to see if the RT count equals 16 as at decision box 226. If not, the N-branch is used to continue counting RT's as indicated at dot 274.

If 16 RTs are counted, system 10 clocks the 10 bit idle counter as indicated at dot 278. Then system 10 checks the 20 idle bit counter as indicated at decision box 280 to see if 10 idle bits have been counted. If not, system 10 uses the N-branch to return to dot 200 to repeat the loop. If so, system 10 provides a HIGH idle signal to the end-user device as indicated at dot 282.

Then system 10 clears any over-range (O-R) error or frame error (FE) as indicated at dot 284. Then system 10 resets the word counter and clears the WR counter as indicated at dots 286 and 288, respectively, before returning to look at the next bits on the link.

Refer now to the timing diagram wherein FIGS. 6 and 7 show timing of system 10. Note in FIG. 6 the sequences required to achieve a HIGH valid start. Note that the bus is no longer in IDLE after the HIGH VALID START.

FIG. 7 shows the timing sequences for a one byte message. These sequences extend from IDLE to the bus being busy and then back to IDLE. Note that the word counter goes from a zero count to a count indicative of the receipt of one word.

I claim:

1. A data reception system for converting serial data messages transmitted over a balanced differential mode communications link at a chosen transfer rate into corresponding parallel data messages for use by an end-user device, the data messages being transmitted as a series of individual mark and space signals of a chosen signal level, the messages comprising a space at the beginning of a word of the message to indicate a start of the message word and a mark at the end of a word to indicate the end of a message word and mixtures of a chosen number of mark and space signals representation of the word with an interval of a chosen number of idle bits placed between the messages, said system comprising:

(a) means for converting the individual mark and space signals into corresponding individual HIGH and LOW unfiltered binary logic bits, said converting means including means for preventing conversion into binary bits the individual mark and space signals which exceed the chosen signal level;

(b) means for determining the start and stop bits and each data bit of each message word;

(c) means for determining the idle bit intervals; and (d) means for forming a parallel message word from a series of bits established from said determining means for start and stop bits and said determining means for idle bit intervals response to the reception of each serially transmitted data message, said means for forming a parallel message word making available said parallel message to the end-user device.

2. Apparatus in accordance with claim 1 wherein said mark and space signal converting means includes a current mode interface module for converting the serial data messages transmitted as current signals and a voltage mode interface module for converting the serial data messages transmitted as voltage signals into said unfiltered binary bits.

3. Apparatus in accordance with claim 2 wherein said data conversion means includes means for filtering each of said unfiltered binary bits to remove noise interference within a chosen frequency spectrum.

4. Apparatus in accordance with claim 1 wherein said means for determining the START and STOP bits of each message includes bit disassembly means for disassembling each filtered bit into a series of bit segments at a specific sequential clock rate, said specific sequential clock rate being a chosen multiple of the chosen transfer rate of the series of individual mark and space signals transmitted over the link.

5. Apparatus in accordance with claim 4 wherein said bit determining means include decoding logic means for establishing a binary state of each bit from a majority of a chosen number of bit segments.

6. Apparatus in accordance with claim 5 wherein said bit determining means includes test means for determining from said series of bit segments said START bit of each word, said test means including a first binary counter means that operates as long as said series of bit segments are of a LOW binary state.

7. Apparatus in accordance with claim 6 wherein said bit determining means includes means for indicating the presence of a valid START bit.

8. Apparatus in accordance with claim 7 wherein said bit determining means includes means for determining the binary state of each bit following said START bit.

9. A serial to parallel data conversion system for converting asynchronous serial message words of a chosen number of bytes transferred over a differential mode balance transmission link as mark and space signals at a chosen transfer rate into parallel message words each of said bytes consisting of a START bit succeeded by a predetermined number of data bits then a STOP bit, each of said message words being spaced apart by an interval of a chosen number of idle bits, said system comprising:

(a) interfacing means coupled to the balance link for receiving the asynchronous serial data words and which produces therefrom a series of unfiltered binary bits in response to the mark and space signals within a predetermined common mode signal range or an out-of-range signal indicative of the mark and space signals exceeding the predetermined common mode signal range, said out-of-range signal persisting until the mark and space signal entering said interface means appear within the predetermined signal range;

(b) filter means adapted to receive the series of unfiltered binary bits from said interfacing means and producing therefrom a series of filtered binary bits free from noise interference within a chosen frequency spectrum;

(c) bit disassembly means arranged to receive each bit of the series of filtered bits from said filter means at the chosen transfer rate and at a specific sequential clock rate time, and segmenting therefrom a regular sequence of individual segments of each of the received bit; said disassemble means including a sequential counter means for generating the specific sequential clock rate time;

(d) decoding logic means disposed to sample said bit segments from said bit disassembly means and after sampling a chosen number of bit segments, producing therefrom a message bit having a value equal to a value of a majority of said bit segments;

(e) test means disposed to receive said regular sequence of individual bit segments from said disassembly means and determining from said sequence of segments, the START bit of each byte;

said test means including (1) a first binary counter means, after being enabled, responsive to the clock rate time from said sequential counter means and producing therefrom a first binary clock rate time; (2) means responsive to a first set of bit segments from said disassembly means occurring during a first time interval of said sequential counter means and producing therefrom a signal for enabling said first binary counter means; (3) means responsive to a second set of bit segments from said disassembly means occurring during a second time interval of said sequential counter means and producing therefrom a reset signal for resetting said first binary counter means upon an absence of said second set of bit segments; and (4) means responsive to a third set of bit segments from said disassembly means occurring during a third time interval of said sequential counter means and producing therefrom a reset signal for resetting said first binary count means upon the an absence of said third set of bit segments or producing a valid start signal upon the occurrence of said third set of bit segments from said disassembly means indicative of the start of one of the bytes of said message word;

(f) an idle bit binary counter means responsive to the clock rate time from said sequential counter means for counting the clock rate time during the presence of the idle bit interval or the absence of the valid start signal and producing therefrom a clock signal indicative of an accumulation of a chosen number of idle bit segments equivalent to an idle bit for storing an idle bit from said segment decoding logic means and also for producing a clock signal indicative of a particular number of sequential clock rate time signals;

(g) a pair of latch means coupled to receive said valid start signal from said valid start signal producing test means for generating signals indicative of the absence of the idle bit interval and the presence of the valid start of the message word;

said pair of latch means including (1) a first latch means coupled to said valid start signal producing means for latching in said valid start signal and producing therefrom a reset signal used for assisting disabling said idle bit binary counter means, and (2) a second latch means having an input coupled to said valid start signal producing means for latching in said valid start signal and producing therefrom idle and not idle signals used for assisting disabling said idle bit counter and used for enabling the counting of word bytes respectively;

(h) an over-range detection means responsive to a certain binary clock rate time from said first binary counter means, to said idle signal from said second latch means and said clock rate time signals from said sequential counter means and to the presence or absence of an outer range signal from said interface means and producing therefrom an out-of-range error signal in response to the presence of such a signal at the certain binary clock rate time;

(i) data bit shift register clock means responsive to a predetermined clock rate time from said binary counter means and from said sequential counter means and producing therefrom a data bit clock signal for storing a data bit having the proper polarity from said segment decoding logic means;

(j) shift register means responsive to said idle bit clock signals from said idle bit counter means, said data bit clock signal from said data bit shift register clock means and said message bit from said segment decoding logic means and storing therefrom in a parallel output shift register a byte word of a chosen length formed from a series of said message bit in response to a chosen number of data bit clock signals and a parallel bit internal of idle bits in response to a chosen number of idle bit clock signals said shift register means also producing a not bus not error signal of said shift register overruns;

(k) data bit counter means responsive to a chosen number of said data bit clock signals, and to a chosen number of said idle bit clock signals and therefrom producing a write signal indicative of the formation of a byte;

(l) a byte counter means responsive to said write signal and after counting a chosen number of write signals, producing a message word indication;

(m) an end of word counter means responsive to said sequential counter clock rate time signals and said write signal and producing therefrom an end of word signal after a predetermined number of clock rate time signals are counted after said word message is generated;

(n) a idle bit counter means responsive to said chosen number of sequential clock rate time signals from said idle bit counter means and to said shift register an undesirable STOP or IDLE bit logic level signal from said shift register means which produces therefrom a frame error signal in the event of the undesirable logic level signal, said undesirable logic level signal from said idle bit counter means being used to reset said idle bit counter means.

* * * * *